United States Patent [19]
Koike

[11] Patent Number: 5,668,753
[45] Date of Patent: Sep. 16, 1997

[54] FERROELECTRIC MEMORY AND METHOD FOR CONTROLLING OPERATION OF THE SAME

[75] Inventor: Hiroki Koike, Tokyo, Japan

[73] Assignee: NEC Corporation, Tokyo, Japan

[21] Appl. No.: 582,734

[22] Filed: Jan. 4, 1996

[30] Foreign Application Priority Data

Jan. 4, 1995 [JP] Japan .................................... 7-000065

[51] Int. Cl.$^6$ .................................................. G11C 11/22
[52] U.S. Cl. ............................................ 365/145; 365/149
[58] Field of Search ................................... 365/145, 149

[56] References Cited

U.S. PATENT DOCUMENTS

| | | | |
|---|---|---|---|
| 4,873,664 | 10/1989 | Eaton, Jr. ................................. | 365/145 |
| 5,029,128 | 7/1991 | Toda ........................................ | 365/145 |
| 5,270,967 | 12/1993 | Moazzami et al. ..................... | 365/145 |

FOREIGN PATENT DOCUMENTS 63-201998  8/1988  Japan .

OTHER PUBLICATIONS

1988 IEEE International Solid–State Circuits Conference (ISSCC). Feb. 18, 1988, Digest of Technical Papers, pp. 130–131, "A Ferroelectric Nonvolatile Memory", by S.S. Eaton et al.

1994 IEEE International Solid–State Circuits Conference (ISSCC). Feb. 18, 1994, Digest of Technical Papers, pp. 268–269, "A 256kb Nonvolatile Ferroelectric Memory at 3V and 100 ns," by T. Sumi et al.

*Primary Examiner*—Joseph A. Popek
*Attorney, Agent, or Firm*—Sughrue, Mion, Zinn, Macpeak and Seas

[57] ABSTRACT

In a ferroelectric memory, when data is read out from a memory cell, for the purpose of minimizing a variation of the voltage on the pair of data signal lines caused by factor other than the current caused due to the polarization of the ferroelectric capacitor, the number of memory cells connected to each one data signal line is limited. Thus, a voltage not smaller than the coercive voltage can be applied between the opposing electrodes of the ferroelectric capacitor, with the result that a sufficient read-out signal voltage can be obtained.

13 Claims, 17 Drawing Sheets

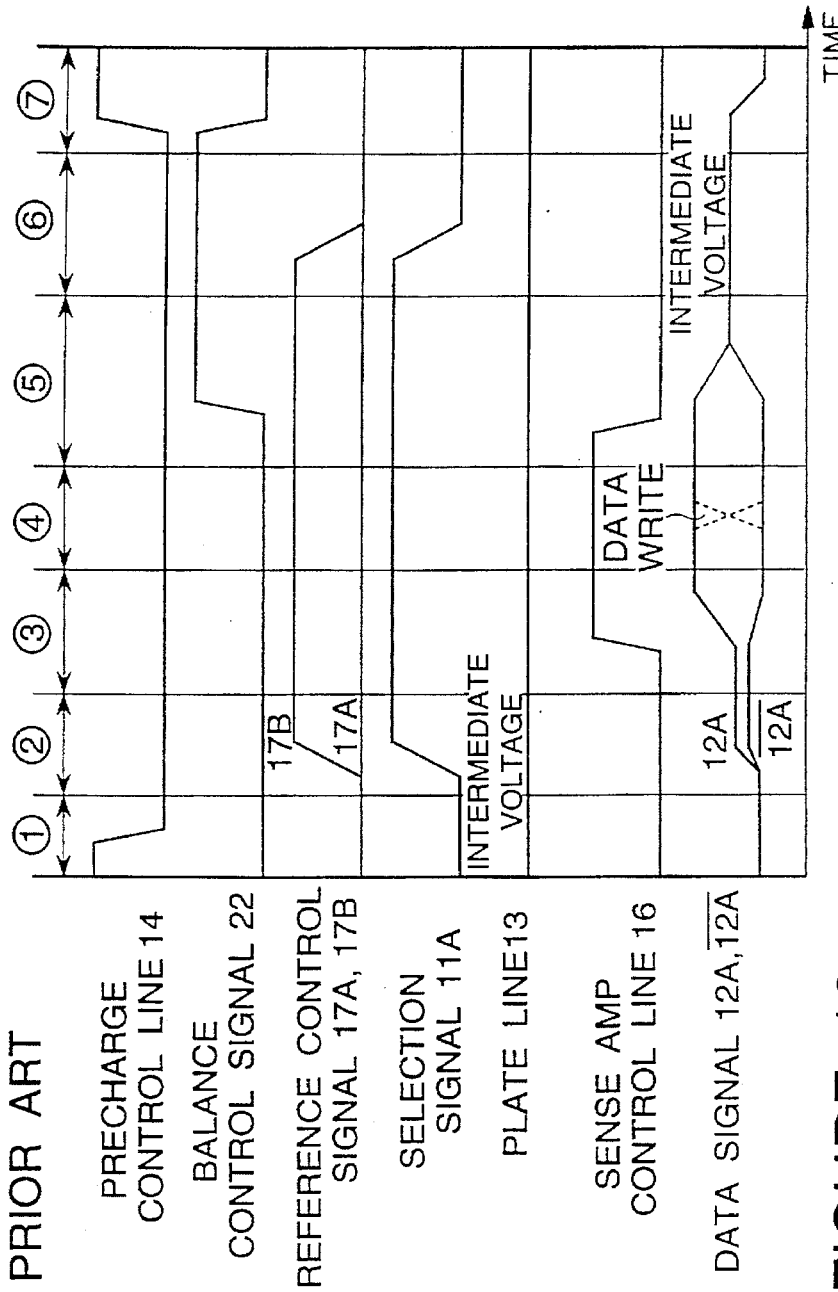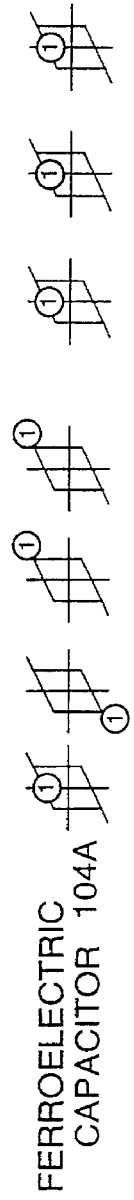
FIGURE 10A
PRIOR ART
FIGURE 10B
PRIOR ART

FERROELECTRIC MEMORY AND METHOD FOR CONTROLLING OPERATION OF THE SAME

BACKGROUND OF THE INVENTION

1. Field of the Invention

The present invention relates to a ferroelectric memory and a method for controlling an operation thereof.

2. Description of Related Art

Recently, a non-volatile memory including memory cells composed of a ferroelectric material such as lead zirconate titanate (PZT) having a hysteresis characteristics so that even if a power supply is shut down, a stored content is held. Some examples of this type memory have been reported in Japanese Patent Application Laid-open Publication No. JP-A-63-201998 (which corresponds to U.S. Pat. No. 4,873,664), 1988 IEEE International Solid-State Circuits Conference (ISSCC), Feb. 18, 1988, Digest of Technical Papers, pages 130–131, and 1994 IEEE International Solid-State Circuits Conference (ISSCC), Feb. 18, 1994, Digest of Technical Papers, pages 268–269, the disclosure of which is incorporated by reference in its entirety into this application.

Now, based on these reports, a circuit construction and an operation of the conventional non-volatile ferroelectric memory will be described.

Referring to FIG. 1, there is shown a circuit of ferroelectric memory cell, which is disclosed in JP-A-63-201998 and in which one memory cell is constituted of two transistors and two capacitors (called a "2T/2C type" hereinafter). In FIG. 1, Reference Numeral 11 designates a memory cell selection signal line (called simple "selection signal line" hereinafter), and Reference Numeral 13 shows a plate line. Reference Numerals 12 and/12 indicate a pair of, complementary signal lines, and Reference Numeral 101 designates a memory cell. Here, in this specification, "/" put just before Reference Numeral such as "12" indicates an upper bar given to the just succeeding Reference Numeral, and means to take a condition ceaseless complementary to the condition of one given with the same Reference Numeral without "/". Reference Numerals 102 and 103 show switching transistors of the memory cell, and Reference Numerals 104 and 105 indicate ferroelectric capacitors.

In the 2T/2C type memory cell as mentioned above, data is written into the ferroelectric capacitors 104 and 105 in such a manner that the ferroelectric capacitors 104 and 105 always have polarization directions opposite to each other. Electric charges from the ferroelectric capacitors 104 and 105 always have polarization directions opposite to each other, are read out to the pair of data signal lines 12 and/12, so that a voltage difference is generated between the pair of data signal lines, and amplified by a sense amplifier which is composed of a differential amplifier circuit.

Referring to FIG. 2, there is shown a mode of the hysteresis characteristics of the ferroelectric capacitors 104 and 105, which indicates a relation between a spontaneous polarization electric charge Q and a voltage V between opposing electrodes of the ferroelectric capacitor. In addition, a polarization electric charge at the voltage of 0 V, will be called a remnant polarization electric charge Qr. For example, it is considered that when the ferroelectric capacitors 104 and 105 are polarized in conditions A and B, respectively, data "1" is stored, and when the ferroelectric capacitors 104 and 105 are polarized in conditions B and A, respectively, data "0" is stored. At this time, when a voltage of Ve is applied between the opposing electrodes of each ferroelectric capacitor, if the data "1" is stored, an electric charge "Q1" is outputted from the capacitor 104 to the data signal line 12 and an electric charge "Q0" is outputted from the capacitor 105 to the data signal line/12. These electric charges will generate a voltage difference between the pair of data signal lines, as mentioned above. Incidentally, a relation between the remnant polarization electric charge Qr and the output electric charges Q0 and Q1 is ideally expressed as follows:

$$2 \times Qr = |Q1 - Q0| \qquad (1)$$

In the above mentioned memory using the ferroelectric capacitor, even if an external voltage applied between the opposing electrodes of each ferroelectric capacitor becomes zero, since the spontaneous polarization internally occurring in the ferroelectric material maintains the data, the data is held after the electric supply is shut down. In other words, so called non-volatile memory operation is realized.

Referring to FIG. 3, there is shown a partial circuit of a memory cell array in a ferroelectric memory using the memory cell of the type shown in FIG. 1. In FIG. 3, Reference Numerals 11A to 11C designate a selection signal line, and Reference Numerals 12A and/12A and 12B and/12B show a data signal line. Reference Numerals 13A to 13C indicate a plate line, and Reference Numeral 14 designates a date signal line precharge control line. Reference Numeral 15 shows a data signal line precharge voltage line, and Reference Numeral 16 indicates a sense amplifier control line. Reference Numerals 101A to 101F designate a memory cell. Reference Numerals 102A and 103A show a switching transistor of the memory cell, and Reference Numerals 104A and 105A indicate a ferroelectric capacitor of the memory cell. Reference Numerals 106A and 106B designate a data signal line precharge circuit, and Reference Numerals 107A and 107B show a sense amplifier.

Now, a reading operation and a writing operation of the memory cell 101A in the ferroelectric memory will be described with reference to FIG. 3 and FIG. 4 which is a timing chart illustrating an operation of the memory cell shown in FIG. 3. Incidentally, in this specification, unless specially indicated, a logical "high level" correspond to a power supply voltage applied from an device external to the memory, or a voltage generated in an internal voltage generating circuit of the memory, and a logical "low level" is a ground level. Accordingly, these voltages can take various values, for example, 5 V, 3 V, etc., dependently upon the case. Furthermore, for reference, the polarized condition of each of the ferroelectric capacitors 104A and 105A at an end of each of periods (1) to (6) in FIG. 4 is shown below the timing chart in FIG. 4.

In FIG. 4, the periods (1) to (3) shows the operation of reading out data from the memory cell. In the period (1), the data signal line precharge control signal 14 is brought to the low level, so at to cancel the precharge condition of the data signal line. Here, the data signal line precharge level is the ground level.

In the next period (2), the selection signal line 11A and the plate line 13A are brought to the high level, so that data is caused to be outputted from the memory cell 101A to the data signal lines 12A and /12A. The data outputted at this time, is determined by the internal polarization condition of the ferroelectric capacitor. The example shown in FIG. 4 shows the reading of the data "1", as will be seen from the explanation made hereinbefore.

In the succeeding period (3), the sense amplifier control line 16 is activated, so that the voltage difference between the pair of data signal line 12A and /12A is sense-amplified.

The periods (4) to (6) illustrate the operation of re-writing the read-out data to the memory cell. At the time of the period (2), since the data of the read-out memory cell is destroyed, this re-writing is necessary. Incidentally, in the case of writing the memory cell with data supplied from a device external to the memory, it is necessary to set a pair of voltages corresponding to a desired data to be written, onto the pair of data signal lines 12A and /12A during the period (3), before the operation of the succeeding periods (4) to (6) is performed.

During the period (4), the plate line 13A is brought to the low level. In the next period (5), the sense amplifier control signal line 16 is brought to the low level, so as to deactivate the sense amplifier, and furthermore, the precharge control signal line 14 is brought to the high level and the data signal lines are brought to the ground level. With this arrangement, the polarization of the capacitors is returned to the condition of the period (1) before the data reading. Finally, during the period (6), the selection signal line 11A is brought to the low level, so as to render the memory cell transistors (switching transistors) non-conductive. Thus, the access to the memory cell is completed.

When the data "0" is stored in the memory cell 101A, the respective polarization conditions of the capacitors 104A and 105A become opposite to those shown in FIG. 4.

Here, a relation between the above mentioned circuit operation and the characteristics of the ferroelectric capacitor will be discussed. For example, the condition of the period (2) of FIG. 4 in which the selection signal line 11A is brought to the high level so as to turn on the switching transistors 102A and 103A and the plate line 13A is brought to the high level, corresponds to the condition in which the voltage of −Ve is applied to the ferroelectric capacitor (assuming that a direction from the plate line to the data signal line is positive in voltage). At this time, the electric charge Q1 or Q0 is outputted to the data signal line 12A. However, regardless of which of the "1" and "0" is stored, the polarization of the ferroelectric capacitor in this condition is at a point "h" as shown in FIG. 2, and therefore, it is not possible to discriminate "1" or "0". Therefore, it is necessary to re-write the data by applying the voltage +Ve or 0 dependently upon the read-out data "1" or "0", to the ferroelectric capacitor. This operation corresponds to the operation during the periods (4) and (5) in FIG. 4.

As mentioned above, in order to realize the non-volatile memory operation by using the ferroelectric memory cell, it is necessary to apply both positive and negative voltages between the opposing electrodes of the ferroelectric capacitor.

In order to realize a high density of memory, there is a memory cell composed of one transistor and one ferroelectric capacitor (called a "1T/1C type" hereinafter). This type of ferroelectric memory cell is reported in 1994 IEEE International Solid-State Circuits Conference (ISSCC), Feb. 18, 1994, Digest of Technical Papers, pages 268–269.

Referring to FIG. 5, one example of the 1T/1C type of ferroelectric memory cell. In FIG. 5, Reference Numeral 11 designates a memory cell selection signal line, and Reference Numeral 12 indicates a signal line. Reference Numeral 13 shows a plate line, and Reference Numeral 101 designates a memory cell. Reference Numeral 102 shows a switching transistor of the memory cell, and Reference Numeral 104 indicates a ferroelectric capacitor. In the following, it is to be noted that elements corresponding or similar to those shown in the preceding drawings are given the same Reference Numerals, and explanation thereof will be omitted.

In addition, FIG. 6 shows a model of the hysteresis characteristics of the ferroelectric capacitor 104 shown in FIG. 5. Differently from the 2T/2C type memory cell, in the 1T/1C type memory cell, the two stable conditions "A" and "B" of the ferroelectric capacitor are considered to correspond the data "1" and "0", respectively.

Referring to FIG. 7, there is shown a partial circuit diagram of a memory cell array using the 1T/1C type memory cell. In this case, for example, when the memory cell 101A is selected, a signal voltage from the memory cell appears only on the data signal line 12A. Thus, when the 1T/1C type memory cell is used, it is necessary to generate a reference level used in the sense amplification, on a pairing data line /12A, by means of a special means. For this purpose, the circuit shown in FIG. 7 additionally includes reference level generating circuit 108A to 108D and control signal lines 17A and 17B for those circuits 108A to 108D. A specific method for generating the reference level, is disclosed for example in the above referred 1994 IEEE International Solid-State Circuits Conference (ISSCC), Feb. 18, 1994, Digest of Technical Papers, "Transaction of International Solid-State Circuits Conference (ISSCC)", pages 268–269. The key point of the reference level generation is to generate an intermediate voltage between the data signal line voltage when the signal corresponding to "1" is read out from the memory cell and the data signal line voltage when the signal corresponding to "0" is read out from the memory cell.

Referring to FIG. 8, there is illustrated a timing chart of an operation of the memory cell 101A in the circuit shown in FIG. 7. Furthermore, for reference, the polarized condition of each of the ferroelectric capacitor 104A at an end of each of periods (1) to (6) in FIG. 4 when the data "1" is read, is shown below the timing chart in FIG. 8.

In the case of reading the signal to the data signal line 12A, the reference level generating circuit 108B is controlled to generate the reference level on the pairing data signal line /12A, so that the reference level generated by the reference level generating circuit 108B is read out to the data signal line /12A. The other operation is the same as that of the 2T/2C type memory cell, and further explanation will be omitted for simplification of description.

The above mentioned example adopts a system of reading the data by driving all the plate lines 13 from the low level to the high level so as to apply both positive and negative voltages to the opposing electrodes of the ferroelectric capacitor. However, it is possible to read the data by setting an intermediate voltage on the plate lines so as to apply both positive and negative voltages to the opposing electrodes of the ferroelectric capacitor. Referring to FIG. 9, there is shown a partial circuit diagram of a memory cell array of a memory adopting such a data reading system. In FIG. 9, Reference Numerals 116A and 116B designate a data signal line precharge balance control circuit, and Reference Numeral 22 shows a data signal line balance control signal line. The other construction is the same as that shown in FIG. 7.

Referring to FIG. 10, there is shown a timing chart illustrating an operation of the memory shown in FIG. 9. Here, it is to be noted that the plate line 13 is fixed to an intermediate between the high level voltage and the low level voltage. Now, the reading and writing operations of the memory cell 101A will be described with reference to FIGS. 9 and 10. Furthermore, for reference, the polarized condition of each of the ferroelectric capacitor 104A at an end of each of periods (1) to (7) in FIG. 10 is shown below the timing chart in FIG. 10.

First, during the period (1), the data signal line precharge control signal 14 is brought to the low level, so as to cancel the precharging condition of the data signal line. Here, the precharge level of the data signal line is the ground level, similar to the above mentioned examples. During the next period (2), the selection signal line 11A is brought to the high level, so as to output the data from the memory cell 101A to the data signal line 12A. Here, a point different from the operation of FIG. 29 is that the plate line 13 is not driven. Since the precharge level of the data signal line is the ground level and the plate line is an intermediate voltage (called Vm), when the memory cell transistor 102A is rendered conductive during the period (2), a voltage of almost −Vm is applied between the opposing electrodes of the ferroelectric capacitors 104A, assuming that the direction from the plate line to the data signal line is a positive voltage. As a result, a signal voltage corresponding to the polarized condition of the ferroelectric capacitor 104A is read out to the data signal line 12A. At the same time, a reference level is applied to the pairing data signal line /12A from the circuit 108B. In the succeeding period (3), the sense amplifier control signal line 16 is activated to sense-amplify a voltage difference between the pair of data signal lines 12A and /12A.

Incidentally, in the case of writing the memory cell with data supplied from a device external to the memory, it is necessary to set a pair of voltages corresponding to a desired data to be written, onto the pair of data signal lines 12A and /12A during the period (4).

During the period (5), the sense amplifier control signal line 16 is brought to the low level so as to deactivate the sense amplifier. In addition, the data signal line balance control signal line 22 is brought to the high level, so as to bring the data signal line level to the intermediate voltage Vm which is the same as that of the plate line. With this arrangement, the polarization of the memory cell capacitor can be returned to the condition just before the data reading.

During the period (6), the selection signal line 11A is brought to the low level, so as to render the memory cell transistor non-conductive. Thereafter, during the period (7), the pair of data signal lines 12A and /12A are precharged to the ground level. Thus, one cycle of a memory cell access operation is completed.

The signal voltage read out from the ferroelectric capacitor depends upon the magnitude of the voltage applied between the opposing electrodes of the ferroelectric capacitor. Generally, the larger the voltage applied between the opposing electrodes of the ferroelectric capacitor is, the larger the obtained signal voltage becomes. In the operation of the above mentioned ferroelectric memory, the magnitude of the voltage applied between the opposing electrodes of the ferroelectric capacitor depends upon the voltage set on the plate line and the amplitude of the voltage of the data signal line. Accordingly, the set voltage of the plate line and the amplitude of the voltage of the data signal line may be set to any value if they makes it possible that the sense amplifier can properly sense-amplifies the signal voltage read out from the ferroelectric capacitor. For example, there is a method of making the set voltage of the plate line to one half of the power supply voltage and of making the amplitude of the voltage of the data signal line between the ground voltage and the power supply voltage. Here, the power supply voltage may be supplied from an external of the memory or may be a voltage generated by a voltage generating circuit provided internally in the memory.

Referring to FIG. 11, there is shown a specific circuit of the data signal line precharge balance control circuit 116A and 116B. Data signal line precharge transistors 117 and 118 are similar to those shown in FIGS. 3 and 7, and additionally, a data signal line balance transistor 119 is provided between the pair of data signal lines 12 and /12. In a condition that the data signal lines 12 and /12 are at the power supply voltage and the ground voltage, respectively, if the transistor 119 is turned on, since the data signal lines 12 and /12 have the same parasitic capacitance, the data signal lines 12 and /12 become a half of the power supply voltage. This circuit is effective when the set voltage of the plate line is similarly a half of the power supply voltage.

The example shown in FIGS. 9 and 10 has been explained in the case of the 1T/1C type memory cell. However, the ferroelectric memory operating without dynamically driving the plate line is not limited by the type of the memory cell. The 2C/2T type shown in FIG. 3 can similarly operate by drive-controlling the corresponding signal lines similarly to the example shown in FIG. 10.

In the examples shown in FIG. 4, 8, and 10, the precharge level of the data signal line is at the ground level. However, the precharge level of the data signal line is not limited to the ground level and may be any value if a not-zero voltage is applied between the opposing electrodes of the ferroelectric capacitor when the selection signal line 11A is brought to the high level.

However, the above mentioned conventional ferroelectric memory has such a problem that when data is read out from the memory cell, a sufficient voltage is not applied between the opposing electrodes of the ferroelectric capacitor because of the following reasons:

In the ferroelectric memory operating while dynamically driving the plate line as the examples explained with reference to FIGS. 4 and 8 (called a "plate drive type" hereinafter), when the data is read out from the memory cell, the bit line becomes floating. Therefore, when the plate line is driven from the low level to the high level, the voltage of the data signal line varies by action of a coupling through the ferroelectric capacitor of the memory cell. As a result, a voltage not smaller than a coercive voltage Vc converted by multiplying a coercive electric field Ec by a film thickness of the ferroelectric material, is not often applied between the opposing electrodes of the ferroelectric capacitor. Accordingly, the polarization inversion of the ferroelectric material does not occur.

This will be explained in detail with reference to FIG. 12, which illustrates the circuit of the 1T/1C type ferroelectric memory cell. In FIG. 12, a parasitic capacitance of the data line is represented by CD, and the capacitance of the normal dielectric component of the ferroelectric capacitor is represented by CS.

Now, assume that in a condition that the memory cell switching transistor 102 is non-conductive, namely, the memory cell 101 is in a non-selected condition, a voltage VBOOT for tuning on the transistor is applied to the selection signal line 11. In addition, the plate line 13 is driven from an initial condition voltage VPL0 to a final condition voltage VPL. Furthermore, it is assumed that an initial voltage and a final voltage of the data Signal line 12 are VDL0 and VDL, respectively. Additionally, an initial voltage of a node 23 interconnecting the transistor 102 and the ferroelectric capacitor 104 is VS0 and a final voltage of the node 23 becomes VDL since the transistor 102 is turned on.

Under the above mentioned condition,

All electric charge Qi of the system shown in FIG. 12 in an initial condition, is expressed as follows:

$$Qi = CS \times (VS0 - VPL0) + CD \times VDL0 \quad (2)$$

All electric charge Qf of the system shown in FIG. 12 in a final condition, is expressed as follows:

$$Qf=CS\times(VDL-VPL)+CD\times VDL \qquad (3)$$

Since Qi must be equal to Qf, an absolute value |VPL−VDL| of the voltage applied between the opposing electrodes of the ferroelectric capacitor is expressed as follows:

$$|VPL-VDL|=\left|\frac{CS\times(VPL0-VS0)+CD\times(VPL-VDL0)}{CD+CS}\right| \qquad (4)$$

On the other hand, since |VPL−VDL| must be not smaller than the coercive voltage Vc of the ferroelectric capacitor, the following relation can be expressed:

$$|VPL-VDL|\geq Vc. \qquad (5)$$

Here, assuming that the precharge voltage of the data signal line is the ground voltage (namely, VDL0=0) and both of the VS0 and VPL0 are the ground level, the equation (5) can be expressed as follows:

$$\left|\frac{CD\times VPL}{CD+CS}\right|\geq Vc \qquad (6)$$

Here, assume that Vc=1.5 V and VPL=3.3 V, the equation (6) can be expressed as follows:

$$CD\geq 0.833\ldots \times CS \qquad (7)$$

This equation (7) indicates that since the parasitic capacitance CD of the data signal line has a lower limit, unless the parasitic capacitance is not smaller than the lower limit, a voltage not smaller than Vc is not applied between the opposing electrodes of the ferroelectric capacitor. Thus, since the voltage of the data signal line is caused to vary by action of the coupling through the ferroelectric capacitor by dynamically driving the plate line, it is generally said that unless the condition defined by the equations (4) and (5) is fulfilled, a sufficient read-out voltage cannot be obtained from the memory cell.

On the other hand, in the ferroelectric memory operating without dynamically driving the plate line, as the examples explained with reference to FIG. 10 (called a "plate non-drive type" hereinafter), a problem similar to that of the plate non-drive type occurs even if the mechanism of generation of the problem is different from that in the plate non-drive type.

In the plate non-drive type of ferroelectric memory, when the memory cell is not accessed, it is necessary to maintain the voltage applied between the opposing electrodes of the ferroelectric capacitor at zero, in order to prevent break of the stored data. In other words, if the plate line is set to the intermediate voltage, a node of one opposing electrode of the ferroelectric capacitor, namely, a node 23 interconnecting the memory cell switching transistor 102 and the ferroelectric capacitor similarly becomes the intermediate voltage. In this condition, if the selection signal line is brought to the high level in order to read out data from the memory cell, first, the electric charge stored in the node 23 interconnecting the memory cell switching transistor 102 and the ferroelectric capacitor similarly becomes the intermediate voltage, is outputted to the data signal line, so that the voltage level of the data signal line changes from the precharge level. As a result, the voltage not smaller than the coercive voltage Vc is no longer applied between the opposing electrodes of the ferroelectric capacitor, so that the polarization inversion of the ferroelectric material no longer occurs.

This will be explained in detail with reference to FIG. 13, which is similar to FIG. 12, except that the voltage of the plate line 13 is fixed to a constant value VPLC.

Now, consider that an initial condition that the memory cell switching transistor 102 is non-conductive, namely, the memory cell 101 is in a non-selected condition, is changed to a final condition after a voltage VBOOT is applied to the selection signal line 11 so as to turn on the transistor 102.

Excepting that the voltage of the plate line 13 is VPLC, the same condition as that explained with reference to FIG. 12 is applied.

All electric charge Qi of the system shown in FIG. 13 in an initial condition, is expressed as follows:

$$Qi=CS\times(VS0-VPLC)+CD\times VDL0 \qquad (8)$$

All electric charge Qf of the system shown in FIG. 13 in a final condition, is expressed as follows:

$$Qf=CS\times(VDL-VPLC)+CD\times VDL \qquad (9)$$

Since Qi must be equal to Qf, an absolute value |VPL−VDL| of the voltage applied between the opposing electrodes of the ferroelectric capacitor in the final condition is expressed as follows:

$$|VPLC-VDL|=\left|\frac{CS\times(VPLC-VS0)+CD\times(VPLC-VDL0)}{CD+CS}\right| \qquad (10)$$

On the other hand, since |VPL−VDL| must be not smaller than the coercive voltage Vc of the ferroelectric capacitor, similarly to the plate drive type, the following relation can be expressed:

$$|VPLC-VDL|\geq Vc. \qquad (11)$$

Here, assuming that the precharge voltage of the data signal line is the ground voltage (namely, VDL0=0) and both of the VS0 and VPLC are one half of the power supply voltage Vcc, the equation (11) can be expressed as follows:

$$\frac{1}{2}\times\left|\frac{CD\times Vcc}{CD+CS}\right|\geq Vc \qquad (12)$$

Here, assume that Vc=1.5 V and VPL=3.3 V, the equation (6) can be expressed as follows:

$$CD\geq 10\times CS \qquad (13)$$

Similarly to the equation (7), this equation (13) indicates that since the parasitic capacitance CD of the data signal line has a lower limit. Also in the plate non-drive type ferroelectric memory, it is generally said that unless the condition defined by the equations (10) and (11) is fulfilled, a sufficient read-out voltage cannot be obtained from the memory cell.

The above mentioned discussion is directed to the lower limit of the parasitic capacitance CD of the data signal line. However, in the reading method in which the signal charge read out from the memory cell is outputted onto the data signal line as the signal voltage, if the 2T/2C type memory cell is used, the signal voltage, VSIG is expressed as follows by using the electric charges Q0 and Q1 shown in FIG. 2 and the electric charge Qr mentioned hereinbefore:

$$VSIG=\left|\frac{Q1-Q0}{CD+CS}\right|=\frac{2\times Qr}{CD+CS} \qquad (14)$$

Here, the equation (1) mentioned hereinbefore was used.

In addition, in the method of using the 1T/1C type memory cell and also using the reference level generating circuit for generating the reference level, the signal voltage VSIG is expressed as follows by using the electric charges Q0 and Q1 shown in FIG. 2 and the electric charge Qr and the equation (1) mentioned hereinbefore:

$$VSIG = \frac{1}{2} \times \left| \frac{Q1-Q0}{CD+CS} \right| = \frac{Qr}{CD+CS} \qquad (15)$$

In the above equation, the factor (½) means that the reference level is determined to be a just intermediate level between the voltage of the data signal line when the data "0" is read out and the voltage of the data signal line when the data "1" is read out. If the reference level generated by the reference level generating circuit is shifted from the just intermediate level, the factor in question no longer is ½, but a value larger than 0 (zero) but smaller than 1.

Furthermore, the signal voltage VSIG defined by the equations (14) and (15) must exceed the minimum voltage value VSE which can be normally amplified by the sense amplifier. Namely, $$VSIG \geq VSE \qquad (16)$$

Namely, the equation (16) means that if the parasitic capacitance CD exceeds a certain value, the signal voltage VSIG becomes too small and therefore smaller than the minimum voltage value VSE which can be normally amplified by the sense amplifier. In other words, the memory cannot operate. Therefore, the parasitic capacitance CD has an upper limit.

Totally considering the above mentioned matters, the ferroelectric memory generally has a relation between the parasitic capacitance CD and the normal dielectric capacitance CS as shown in FIG. 14. In FIG. 14, the one-dot chain line indicates the lower limit of the parasitic capacitance CD in the plate drive type ferroelectric memory, and the dotted line indicates the lower limit of the parasitic capacitance CD in the plate non-drive type ferroelectric memory. The solid line indicates the upper limit of the parasitic capacitance CD required for obtaining from the memory cell the read-out signal voltage which can be normally data-amplified by the sense amplifier. The hatched region indicates an operation range in which the plate drive type and the plate non-drive type can operate.

In summary, the conventional ferroelectric memories have a problem in which when the data is read out from the memory cell, the voltage of the data signal line varies, although the mechanism of the voltage variation is different from one operation system to another, and in some condition, the coercive voltage Vc required to invert the polarization is not applied between the opposing electrodes of the ferroelectric capacitor, with the result that a normal data reading cannot be performed.

SUMMARY OF THE INVENTION

Accordingly, it is an object of the present invention to provide a ferroelectric memory and a method for controlling an operation thereof, which has overcome the above mentioned defect of the conventional ones.

Another object of the present invention is to provide a ferroelectric memory and a method for controlling an operation thereof, capable of perform a stable operation, by obtaining a sufficient read-out signal voltage.

The above and other objects of the present invention are achieved in accordance with the present invention by a ferroelectric memory comprising, a plurality of pairs of data signal lines for outputting and receiving data, a plurality of selection signal lines selected in accordance with an address signal, and a plurality of unitary memory cell arrays each arranged along a corresponding one pair of data signal lines of the plurality of pairs of data signal lines, each of the unitary memory cell arrays including:

a plurality of memory cells each including a ferroelectric capacitor having a capacitor dielectric composed of a ferroelectric material and sandwiched between a pair of opposing electrodes, a switching means connected to the ferroelectric capacitor and one of the corresponding pair of data signal lines, and controlled by a corresponding one of the selection signal lines, so that different polarized conditions of the ferroelectric capacitor correspond to different conditions of stored data, respectively, and when a first voltage, which is not zero, is applied between the opposing electrodes of the ferroelectric capacitor, since a current flowing between the ferroelectric capacitor and the corresponding data signal line is different dependently upon the polarized condition of the ferroelectric capacitor, the current is detected or a voltage appearing on the corresponding pair of data signal lines due to the current is detected for the purpose of reading out the stored data;

a means connected to the corresponding one pair of data signal lines, for detecting a current or voltage difference appearing between the corresponding pair of data signal lines; and a means connected to at least one of the corresponding pair of data signal lines, for temporarily controlling a parasitic capacitance of the at least one of the corresponding pair of data signal lines to an optimum value, when data is read out from a memory cell, for the purpose of minimizing a variation of the voltage on the at least one of the corresponding pair of data signal lines caused by factor other than the current caused due to the polarization of the ferroelectric capacitor.

According to another aspect of the present invention, there is provided a method for controlling an operation of the above mentioned ferroelectric memory, the method performing the reading of data from the memory cell to be read out, by setting the corresponding data signal line connected to the memory cell to be read out, to a second voltage, by setting a plate line connected to the memory cell to be read out, to a third voltage which is different from the second voltage and also different from a voltage before the data reading operation, by setting the selection signal line connected to the memory cell to be read out, to a voltage for selecting the memory cell to be read out, so that a voltage difference is caused to occur between the opposing electrodes of the ferroelectric capacitor, whereby a signal corresponding to the data stored in the memory cell to be read out is outputted to the corresponding data signal line.

In the above mentioned arrangement, according to the present invention, the means for adjusting the number of memory cells connected to one data signal line, is provided as a means for suppressing the voltage variation of the data signal line when data is read out from the memory cell, so that a voltage not smaller than the coercive voltage Vc is surely applied between the opposing electrodes of the ferroelectric capacitor. Thus, the ferroelectric memory can be stably operated.

The above and other objects, features and advantages of the present invention will be apparent from the following description of preferred embodiments of the invention with reference to the accompanying drawings.

BRIEF DESCRIPTION OF THE DRAWINGS

FIGS. 10A and 10B are timing charts illustrating an operation of the memory cell shown in FIG. 9;

DESCRIPTION OF THE PREFERRED EMBODIMENTS

Figure 7:
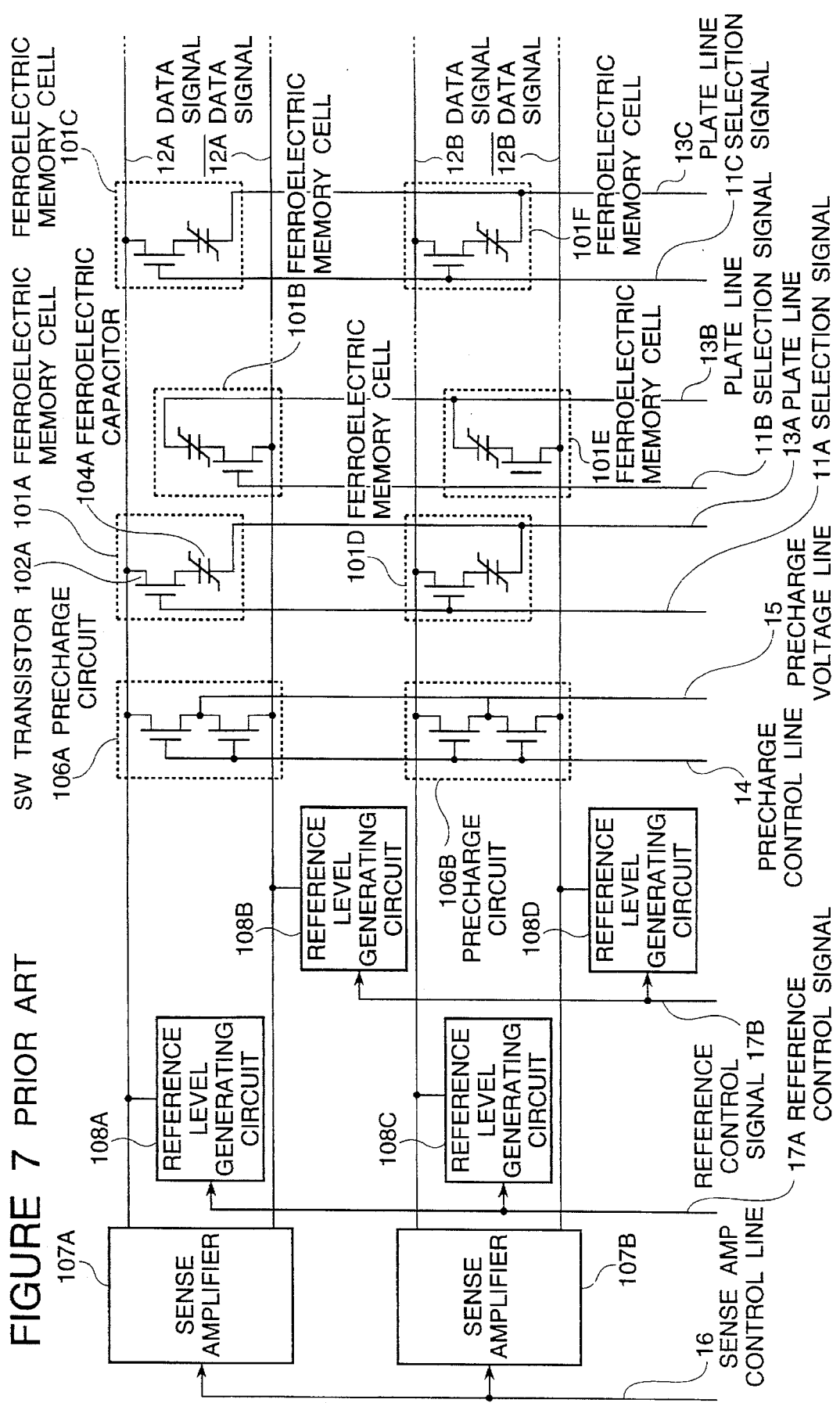
FIG. 7 is a partial circuit of a memory cell array in the ferroelectric memory using the memory cell of the type shown in FIG. 5.
Figure 8A:
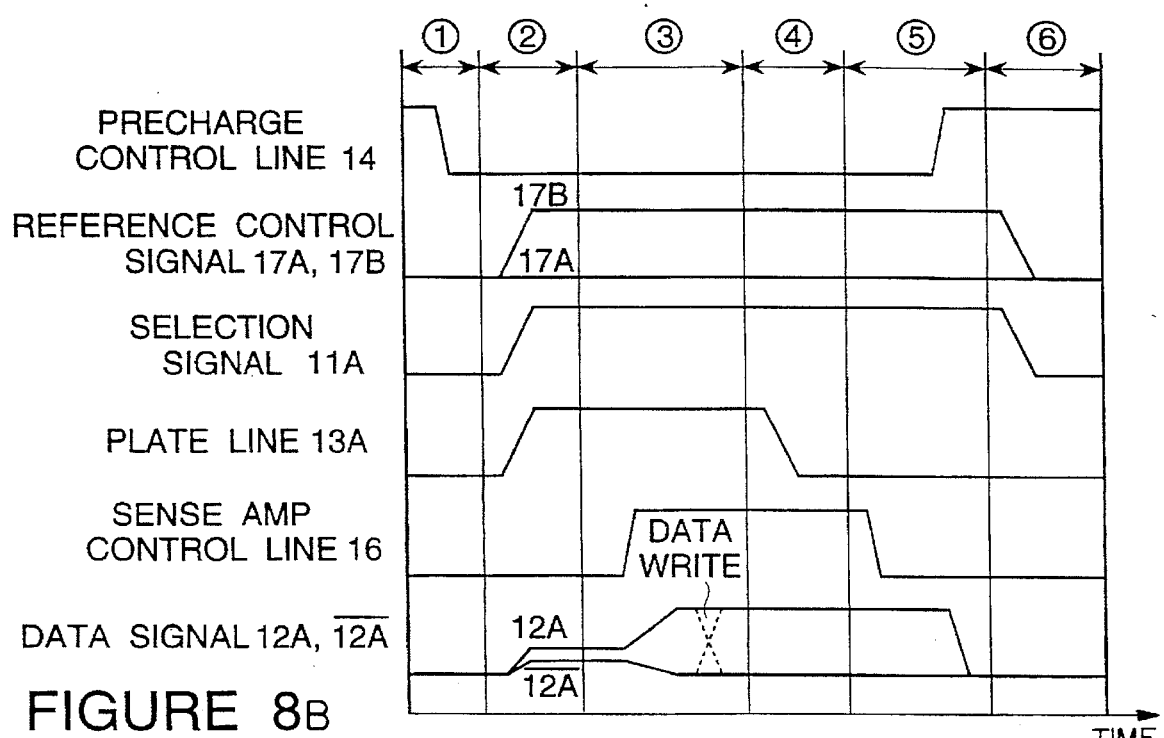
FIGS. 8A and 8B are timing charts illustrating an operation of the memory cell shown in FIG. 7.
Figure 8B:
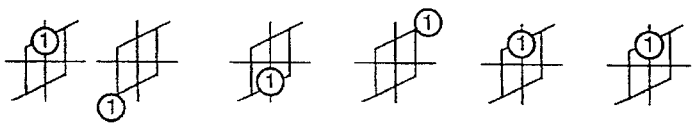
Figure 15:
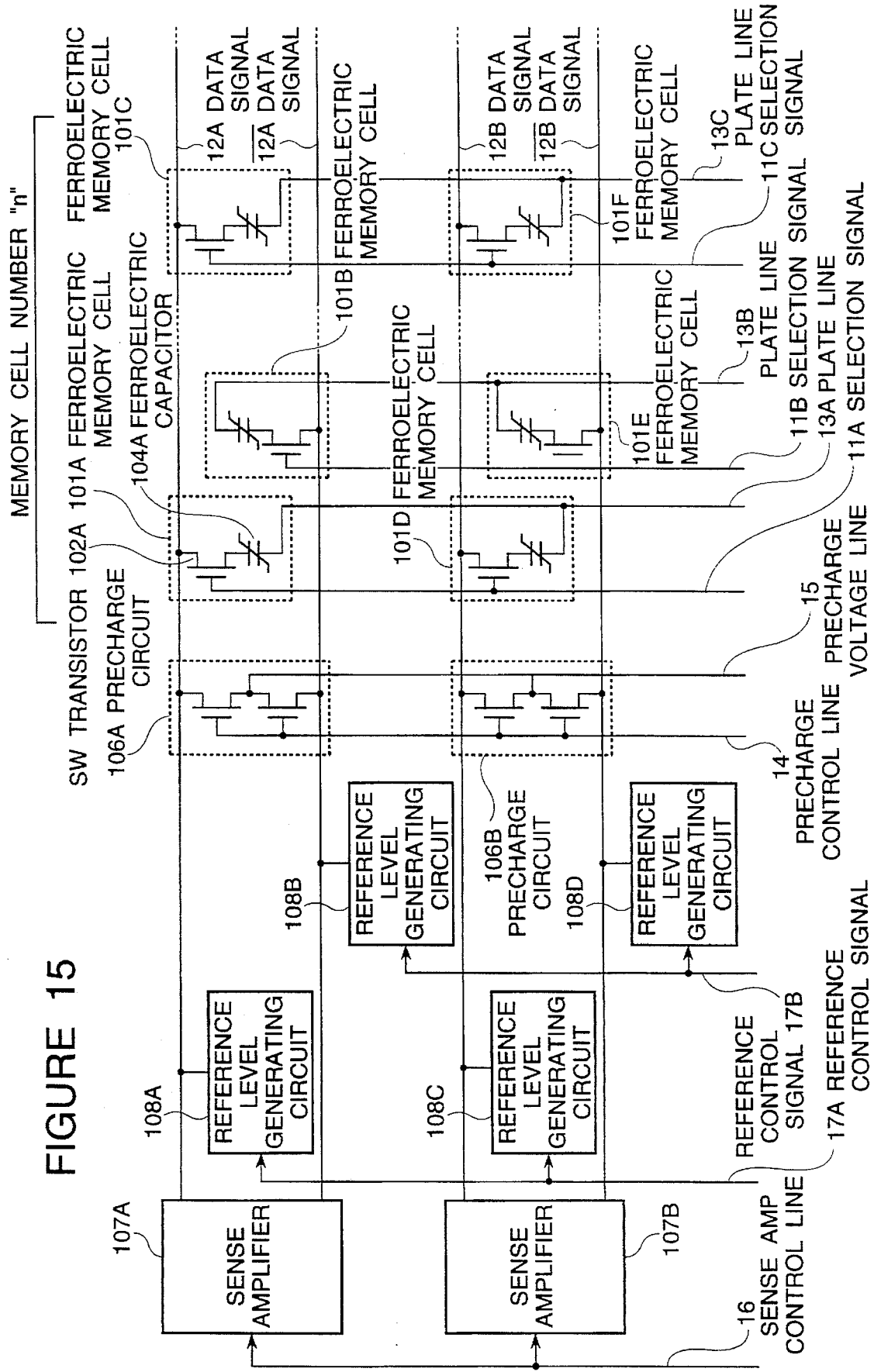
FIG. 15 is a circuit diagram of a first embodiment of the ferroelectric memory in accordance with the present invention, provided with a circuit adjusting the number of memory cells connected to one data signal line, for adjusting the data signal line parasitic capacitance.

Referring to FIG. 15, there is shown a circuit diagram of a first embodiment of the ferroelectric memory in accordance with the present invention. FIG. 15 illustrates an embodiment in which the present invention is applied to a ferroelectric memory composed of 1T/1C type memory cells and adopting the plate drive type data reading system, as explained with reference to FIGS. 7 and 8.

Figure 16:
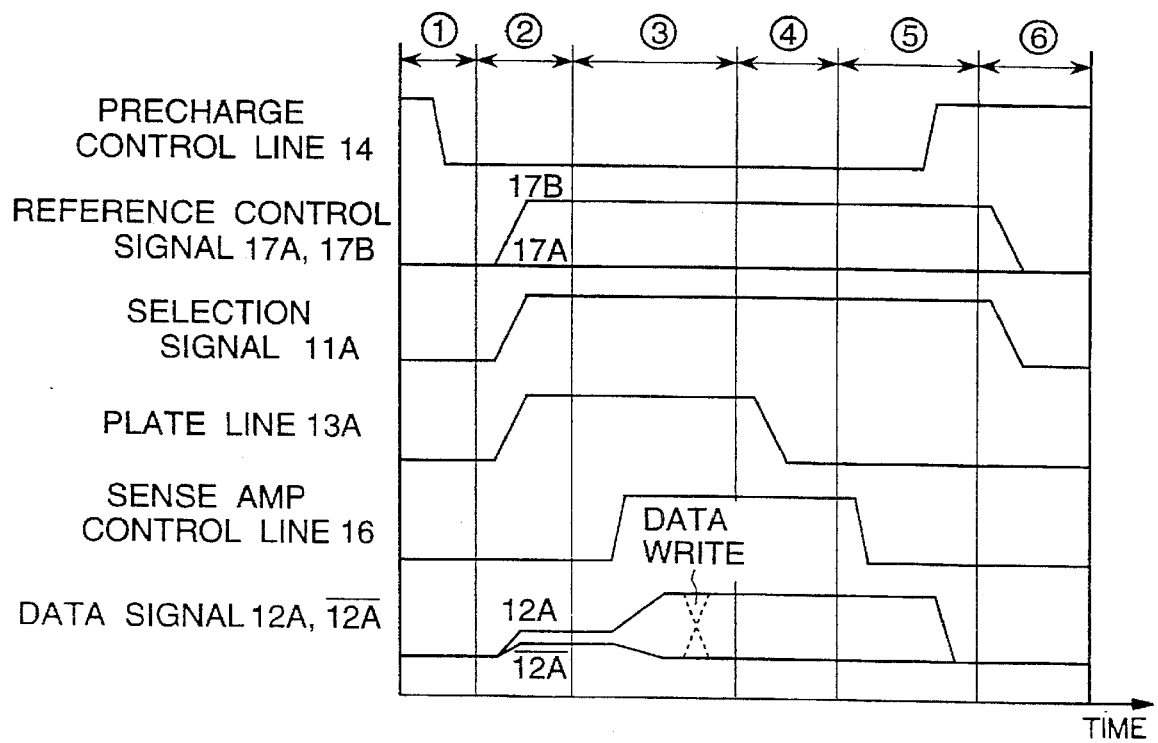
FIG. 16 is a timing chart illustrating an operation of the memory shown in FIG. 15.

First, the parasitic capacitance CD of the data signal line is set to fulfil the equations (4) and (4) as mentioned above. Specifically, the number "n" of memory cells connected per one data signal line is selected so as to adjust the parasitic capacitance CD. The timing chart of the data writing and reading operations to the memory cell is shown in FIG. 16, but since this is similar to that explained with reference to FIG. 8, explanation will be omitted.

Now, an example for determining the memory cell number "n" will be described. Generally, since the equations (4) and (5) or the equations (6) and (7) derived therefrom will determine the lower limit of the parasitic capacitance CD, the lower limit of the number of memory cells connected to one data signal line is determined. For example, the ferroelectric memory is so assumed that the parasitic capacitance CS is 200 fF, the data signal line parasitic capacitance per one memory cell is 5 fF, and the parasitic capacitance of the sense amplifier, the precharge circuit, etc. associated with the data signal line, excluding the memory cells, is 50 fF. Under this assumption, if the equation (7) is applied (accordingly, the condition of the operation voltage and others is in accordance with the equation (7)) to obtain the lower limit of the number "n" of memory cells connected to one data signal line enabling the operation of the plate drive type, the following relation can be obtained:

$$50fF + 5fF \times n \geq 0.833 \ldots \times 200fF \tag{17}$$

Accordingly, the following relation can be obtained:

$$n \geq 23 \tag{18}$$

Figure 9:
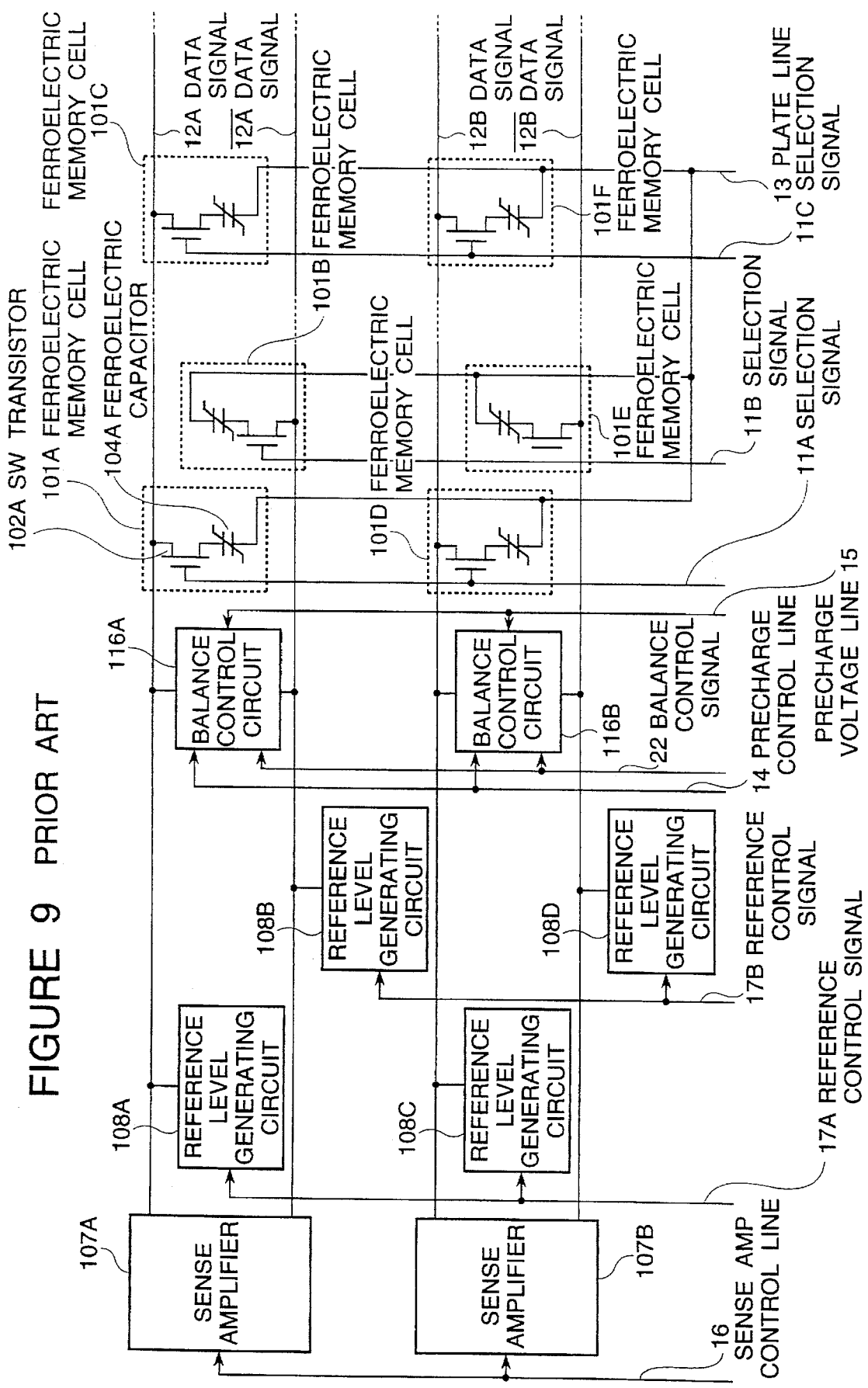
FIG. 9 is a partial circuit of a memory cell array in the plate non-drive type ferroelectric memory.
Figure 11:
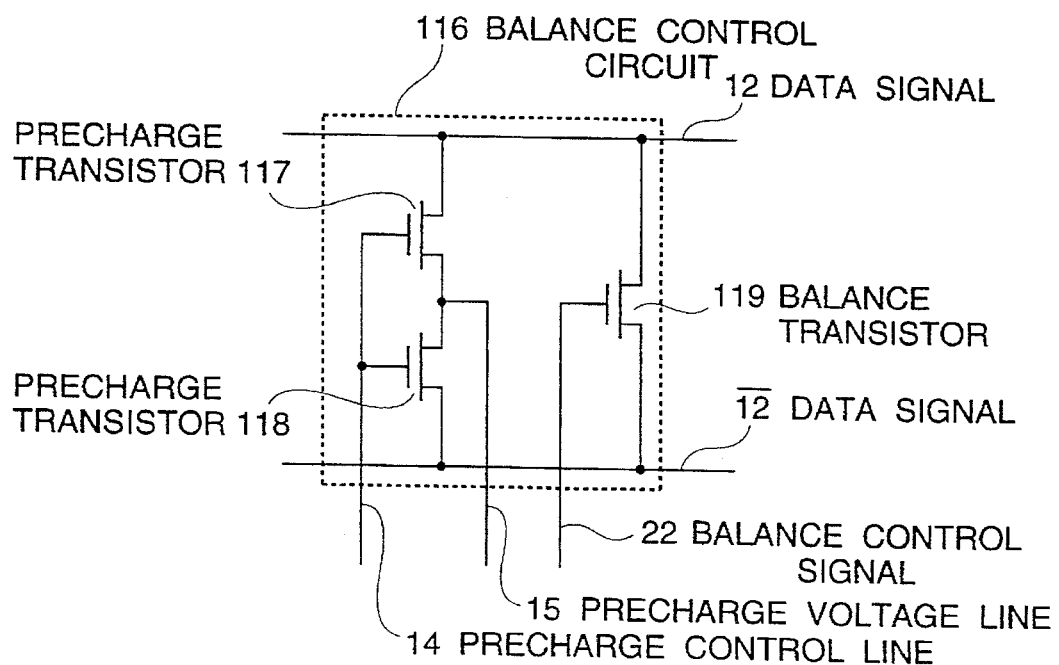
FIG. 11 is a circuit diagram of a specific circuit of the data signal line precharge balance control circuit.
Figure 12:
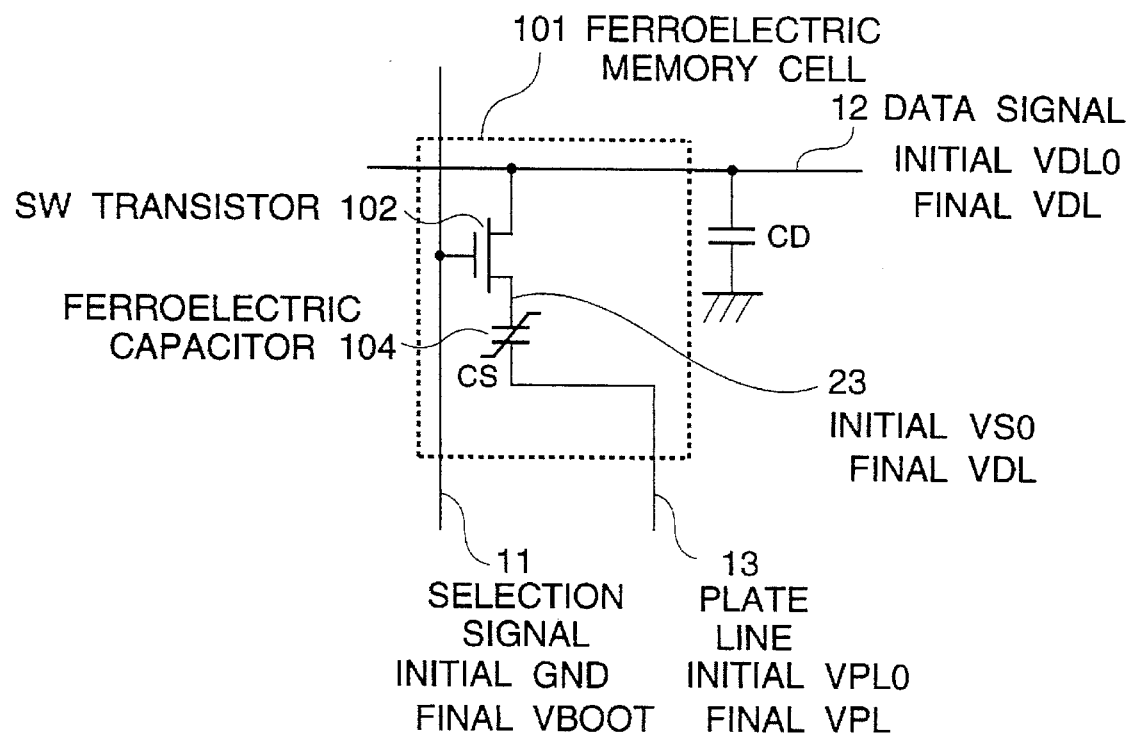
FIG. 12 is a circuit diagram for illustrating the voltage variation of the data signal line when the data is read out from the memory cell in the plate drive type ferroelectric memory.
Figure 13:
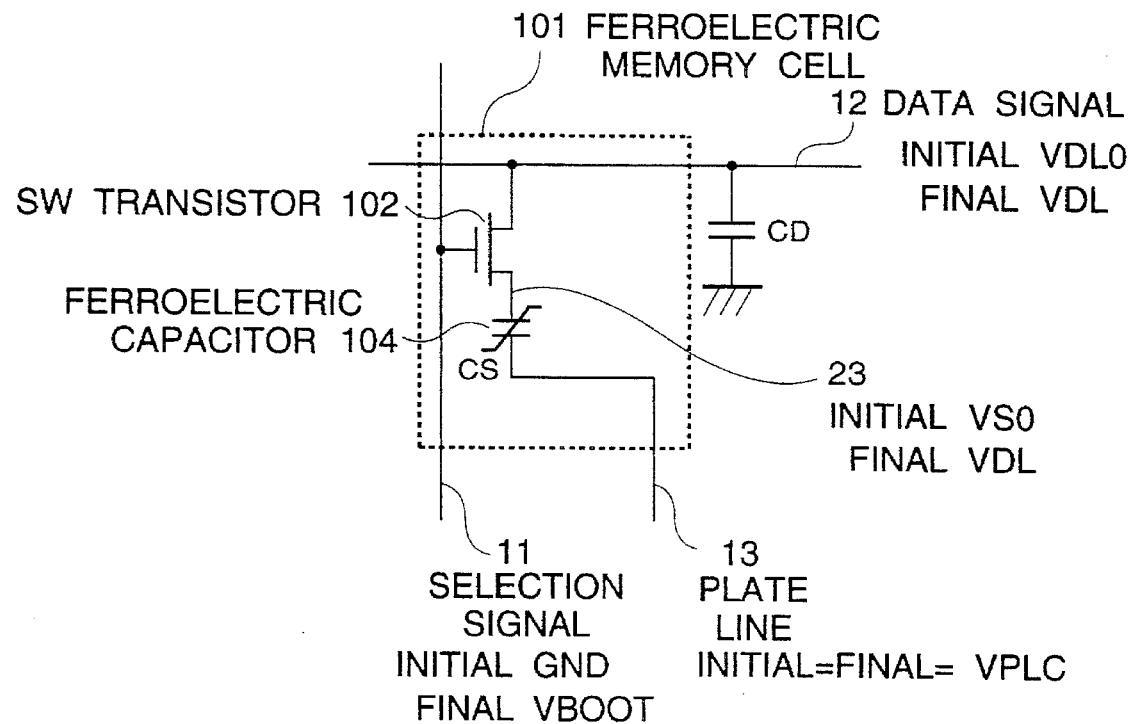
FIG. 13 is a circuit diagram for illustrating the voltage variation of the data signal line when the data is read out from the memory cell in the plate non-drive type ferroelectric memory.
Figure 14:
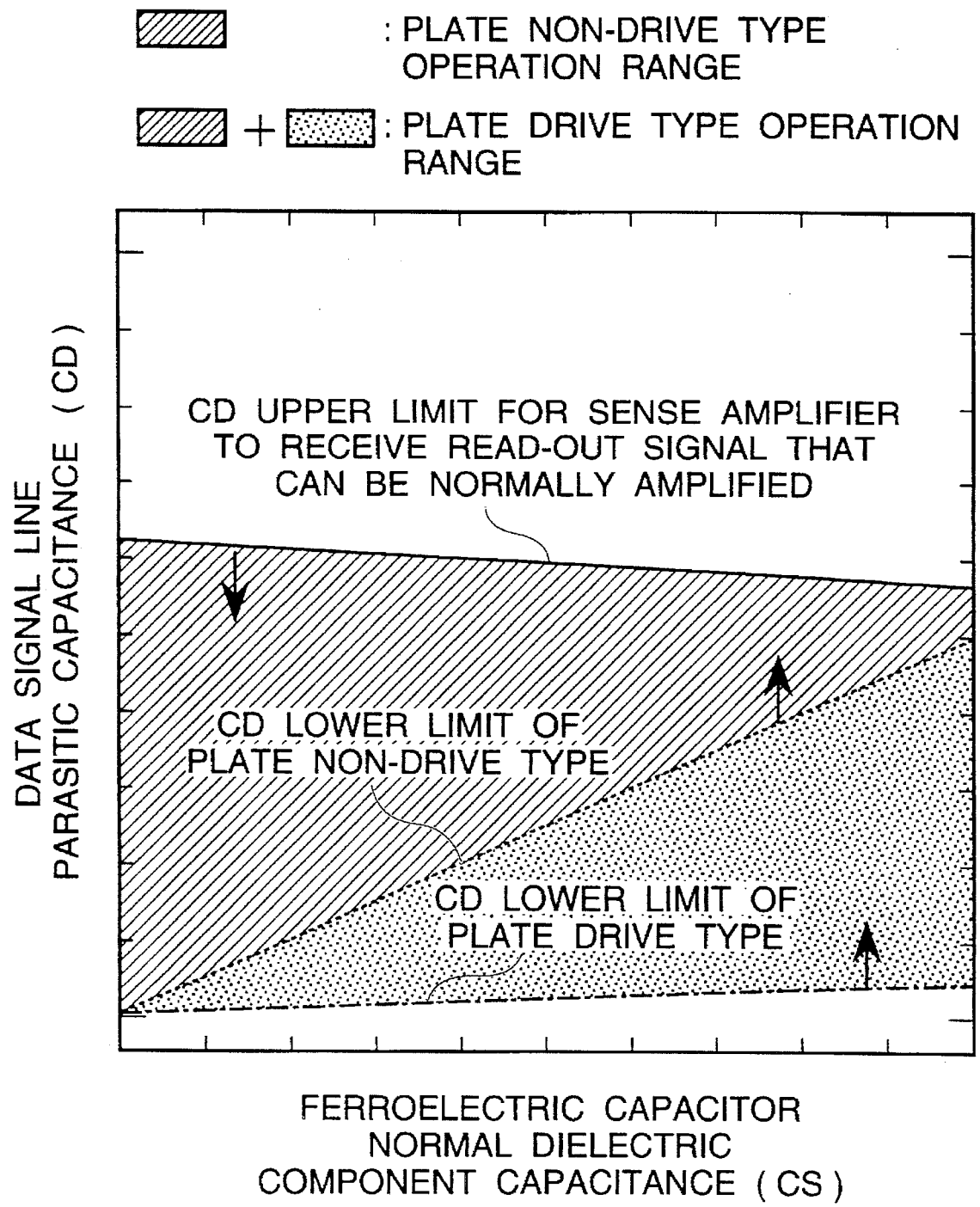
FIG. 14 illustrates a relation between the data signal line parasitic capacitance and the normal dielectric capacitance of the ferroelectric capacitor, and an operation range of the ferroelectric memory.
Figure 17:
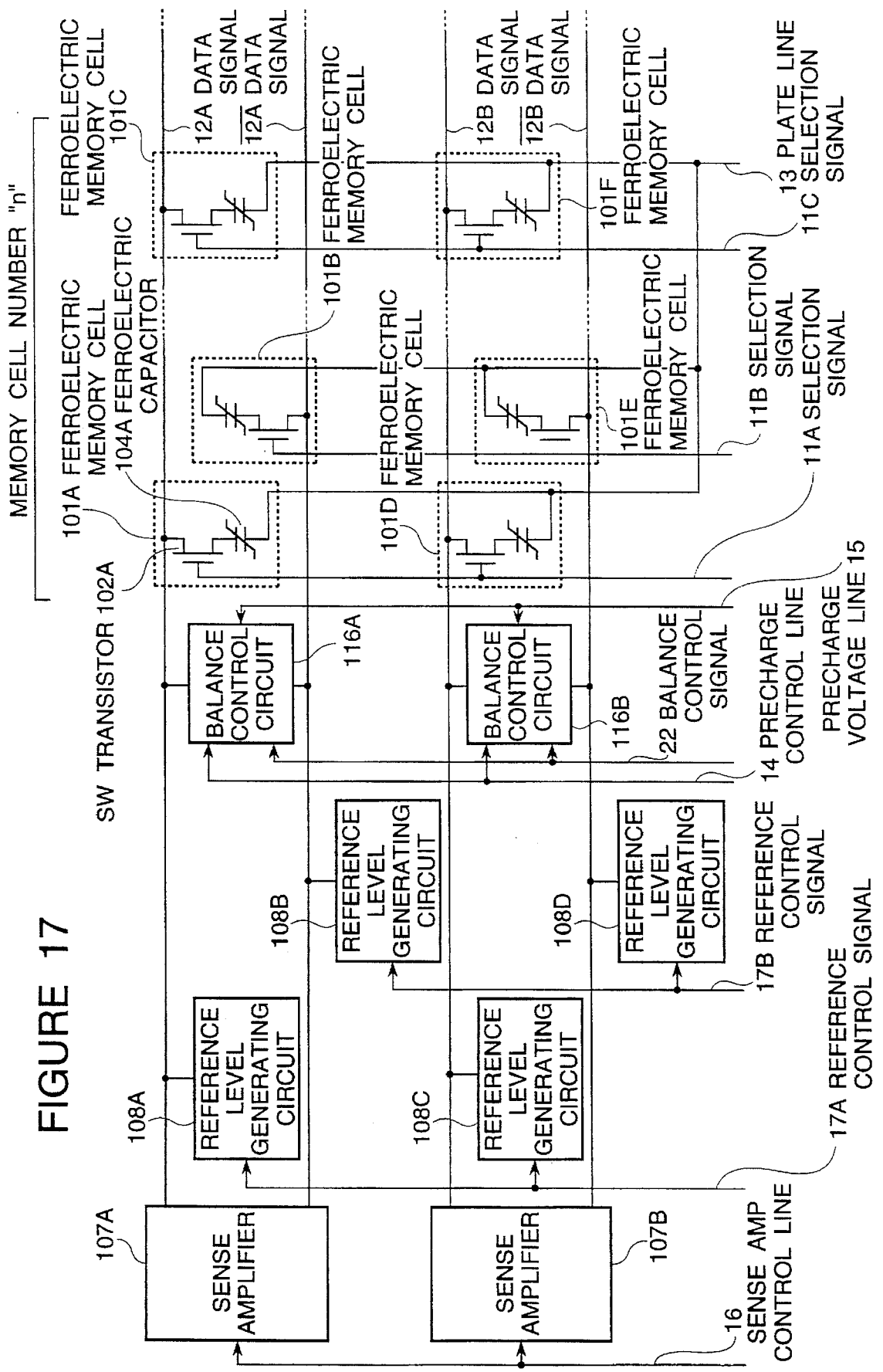
FIG. 17 is a circuit diagram of a second embodiment of the ferroelectric memory in accordance with the present invention, provided with a circuit adjusting the number of memory cells connected to one data signal line, for adjusting the data signal line parasitic capacitance.
Figure 18:
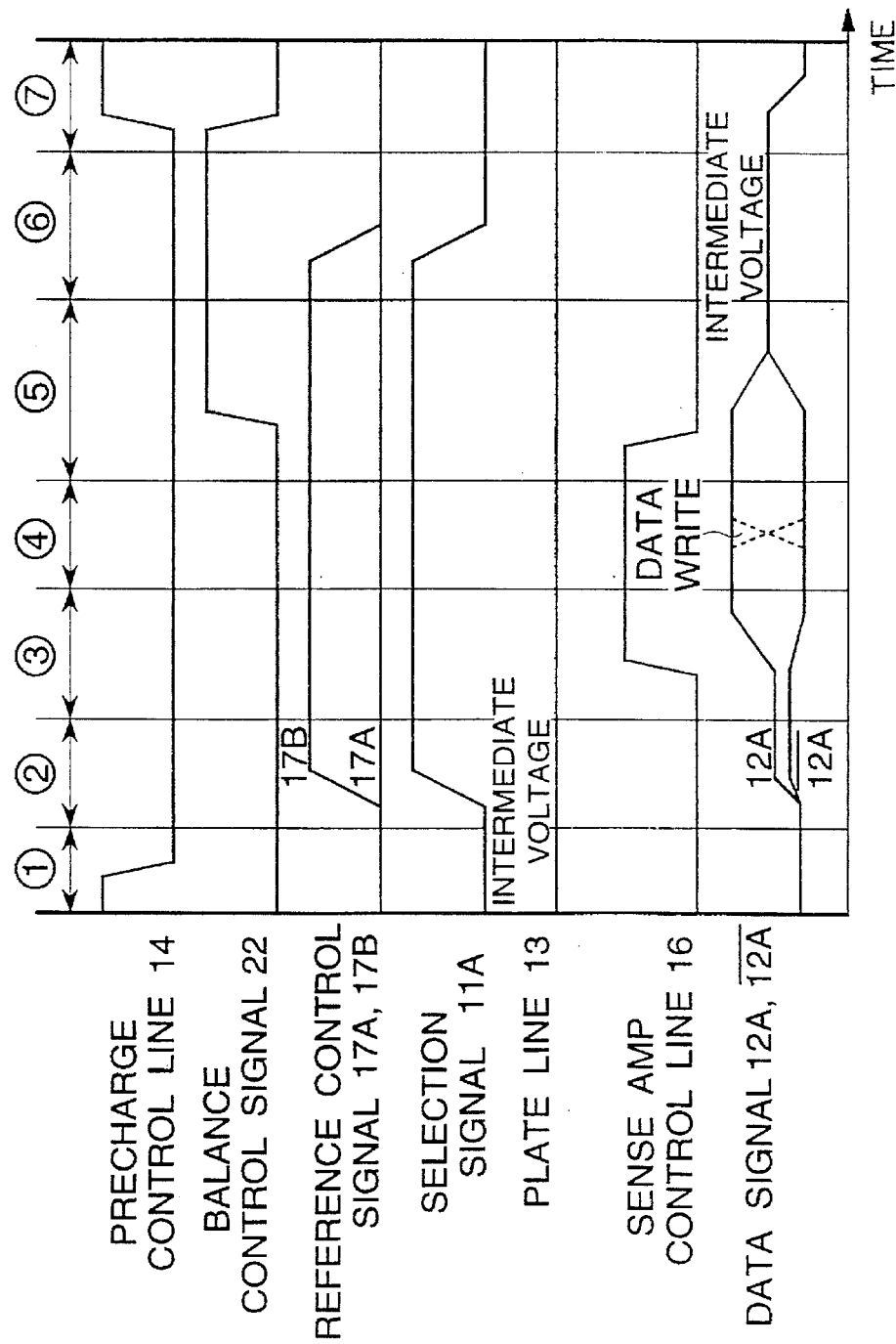
FIG. 18 is a timing chart illustrating an operation of the memory shown in FIG. 17.

The present invention can be applied to the ferroelectric memory of the plate non-drive type as shown in FIG. 9 and 10. FIG. 17 shows a circuit diagram of the ferroelectric memory of the plate non-drive type applied with the present invention, and FIG. 18 is a timing chart illustrating an operation of the memory shown in FIG. 17.

In this case, in order to fulfil the relation defined by the equations (10) and (11), the number of memory cells connected to one data signal lines is determined similarly to the first embodiment. The data writing and reading operations to the memory cell is similar to that explained with reference to FIG. 10, and therefore, explanation will be omitted.

If the same conditions as those used in the plate drive type ferroelectric memory is applied in determining the number "n", the number "n" is determined to fulfil the equations (10) and (11) and the equations (12) and (13) derived therefrom. Under this assumption, if the equation (13) is applied (accordingly, the condition of the operation voltage and others is in accordance with the equation (13)), the following relation can be obtained:

$$50fF + 5fF \times n \geq 10 \times 200fF \tag{19}$$

Accordingly, the following relation can be obtained:

$$n \geq 390 \tag{20}$$

On the other hand, in each of the above mentioned first and second embodiments, the upper limit of the number of memory cells connected to one data signal line is determined from the condition for obtaining from the memory cell the signal voltage which can be normally amplified by the sense amplifier, as explained hereinbefore.

Figure 1:
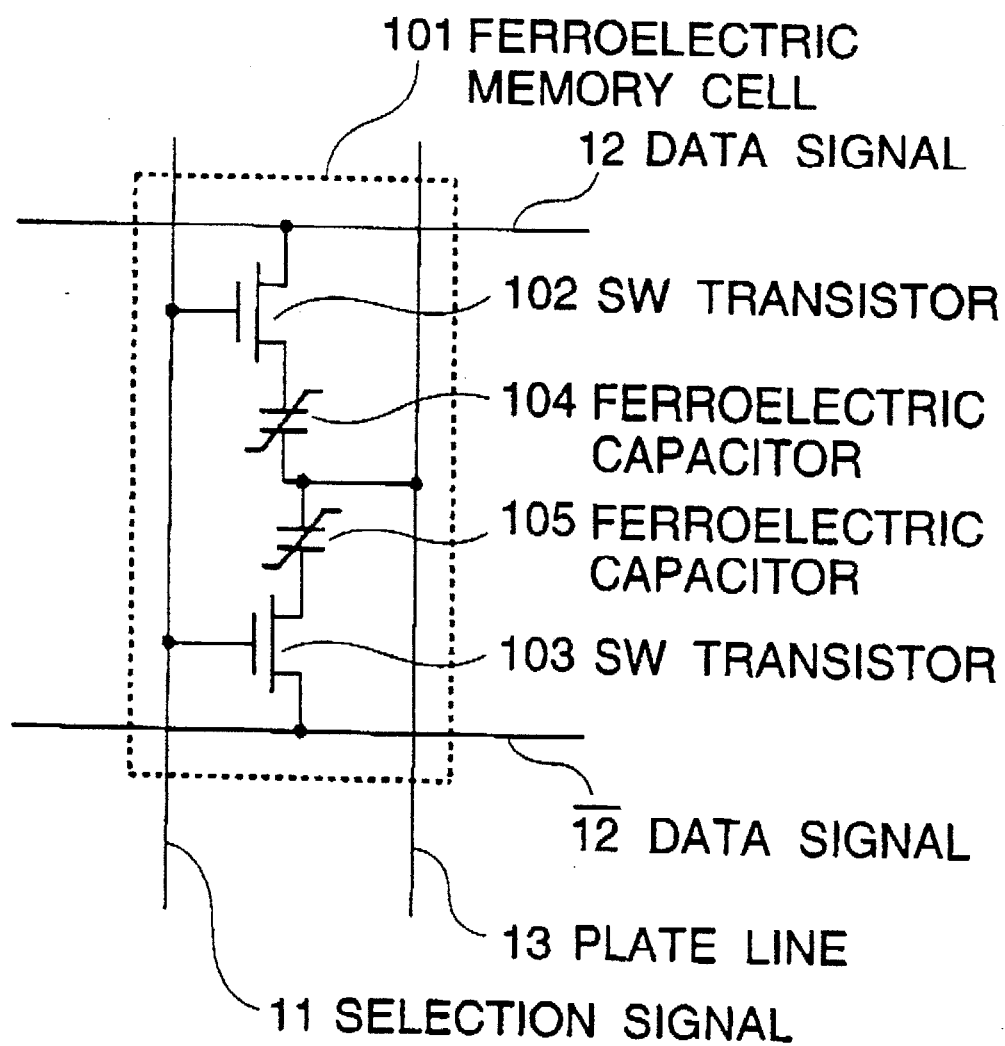
FIG. 1 a circuit diagram of the conventional ferroelectric memory cell constituted of two transistors and two ferroelectric capacitors.
Figure 2:
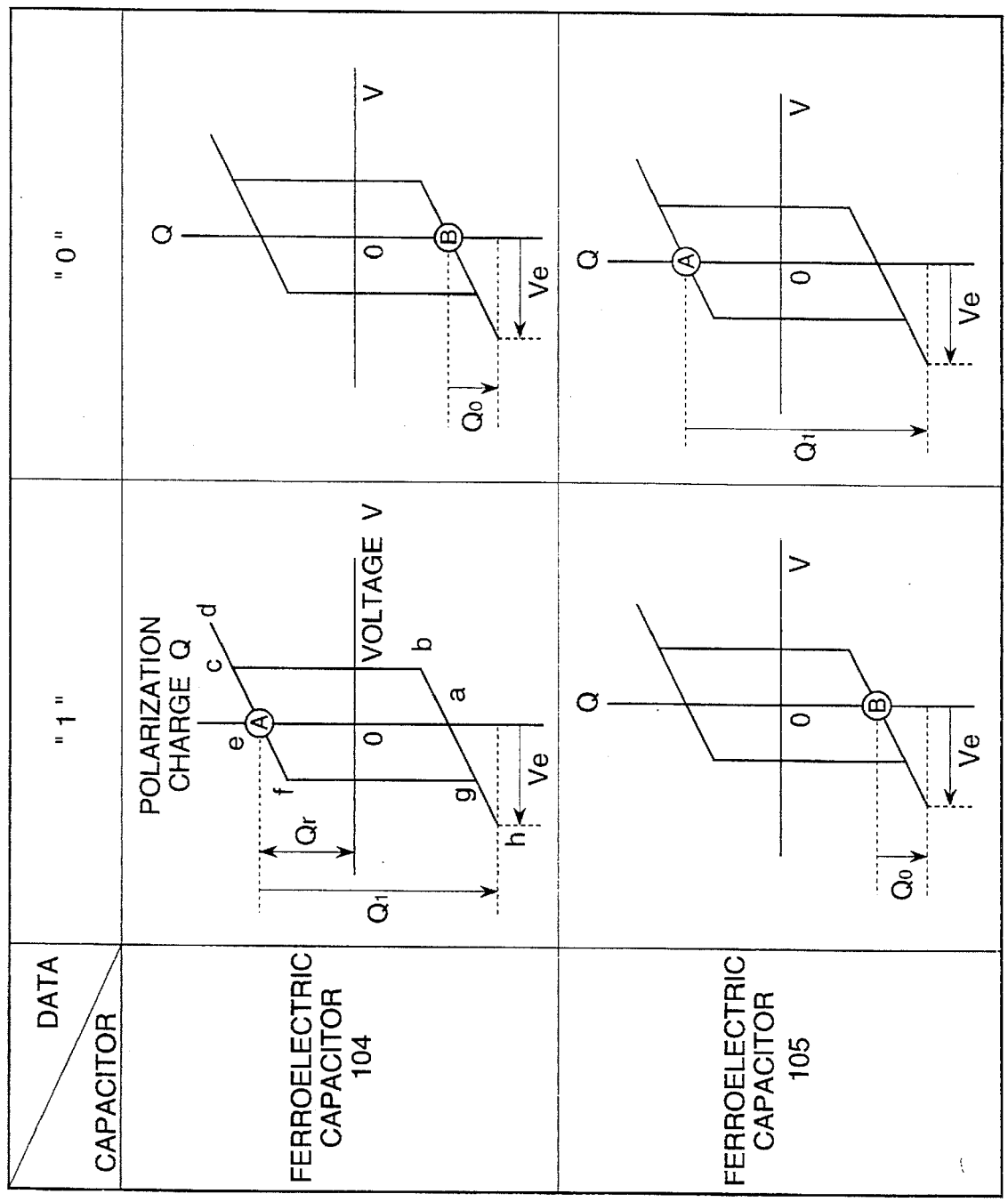
FIG. 2 illustrates a relation between the relation between the spontaneous polarization electric charge and the voltage between opposing electrodes of the ferroelectric capacitor, in the ferroelectric memory cell of the type shown in FIG. 1.
Figure 3:
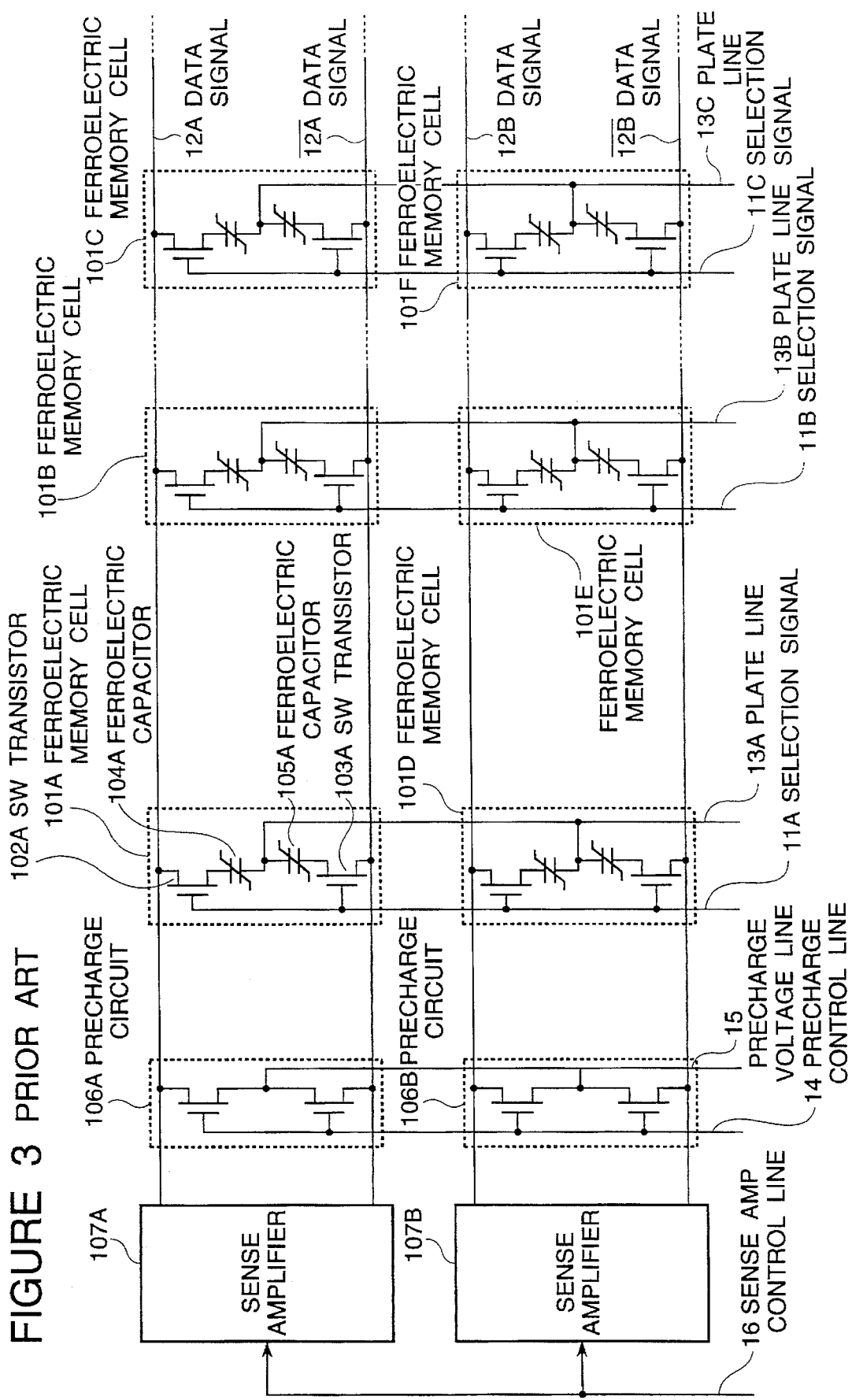
FIG. 3 is a partial circuit of a memory cell array in the ferroelectric memory using the memory cell of the type shown in FIG. 1.
Figure 4A:
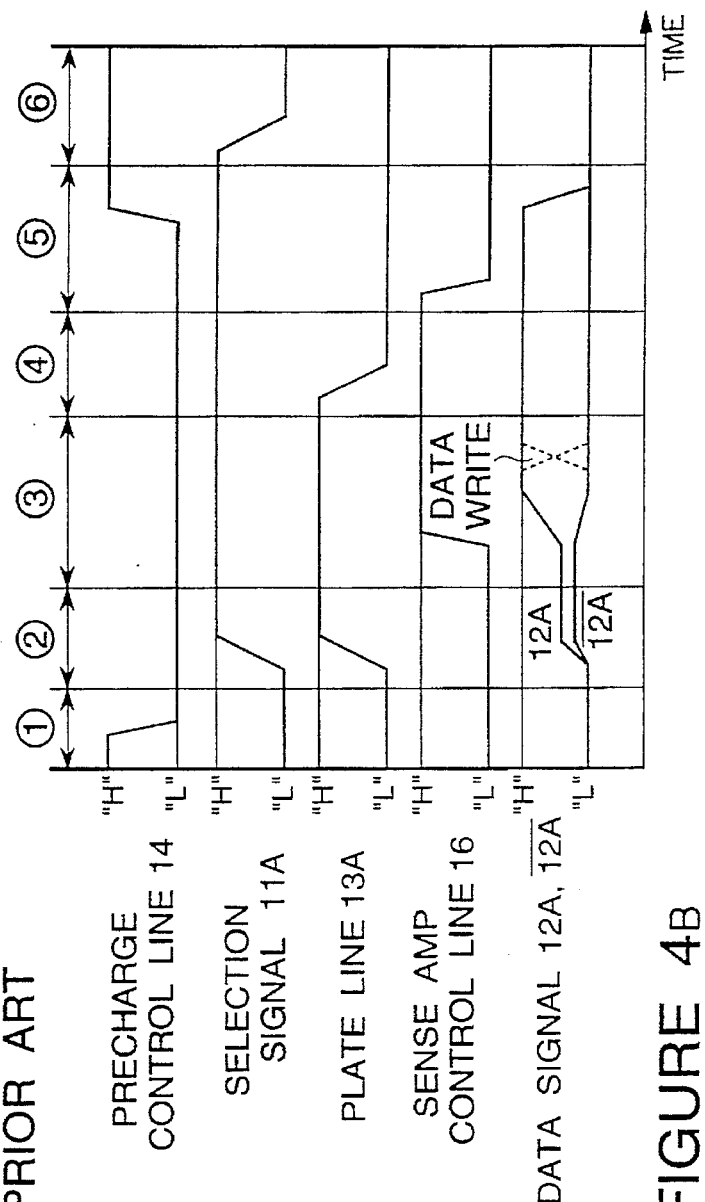
FIGS. 4A and 4B are timing charts illustrating an operation of the memory cell shown in FIG. 3.
Figure 4B:
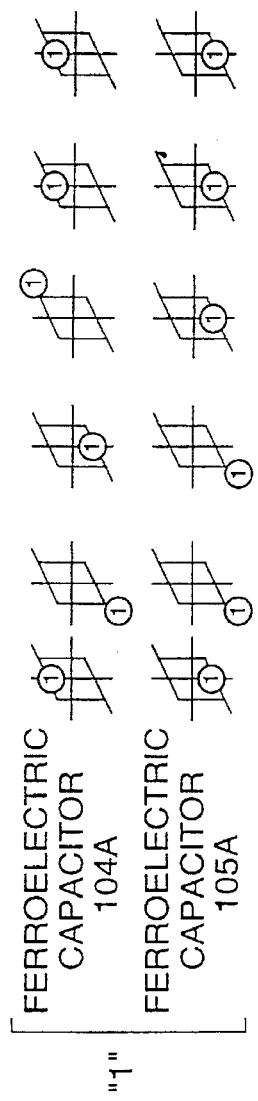
Figure 5:
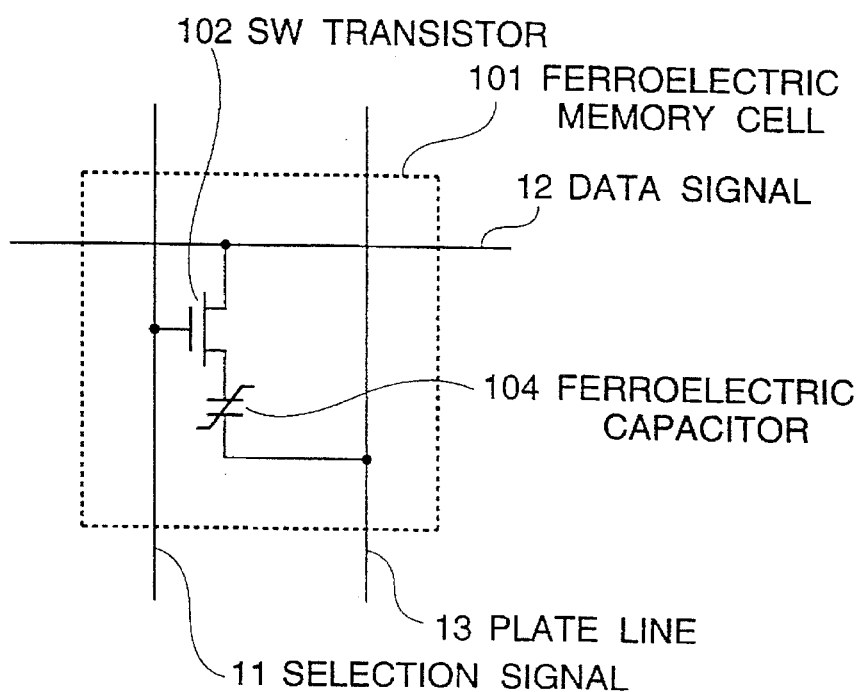
FIG. 5 a circuit diagram of the conventional ferroelectric memory cell constituted of one transistor and one ferroelectric capacitor.
Figure 6:
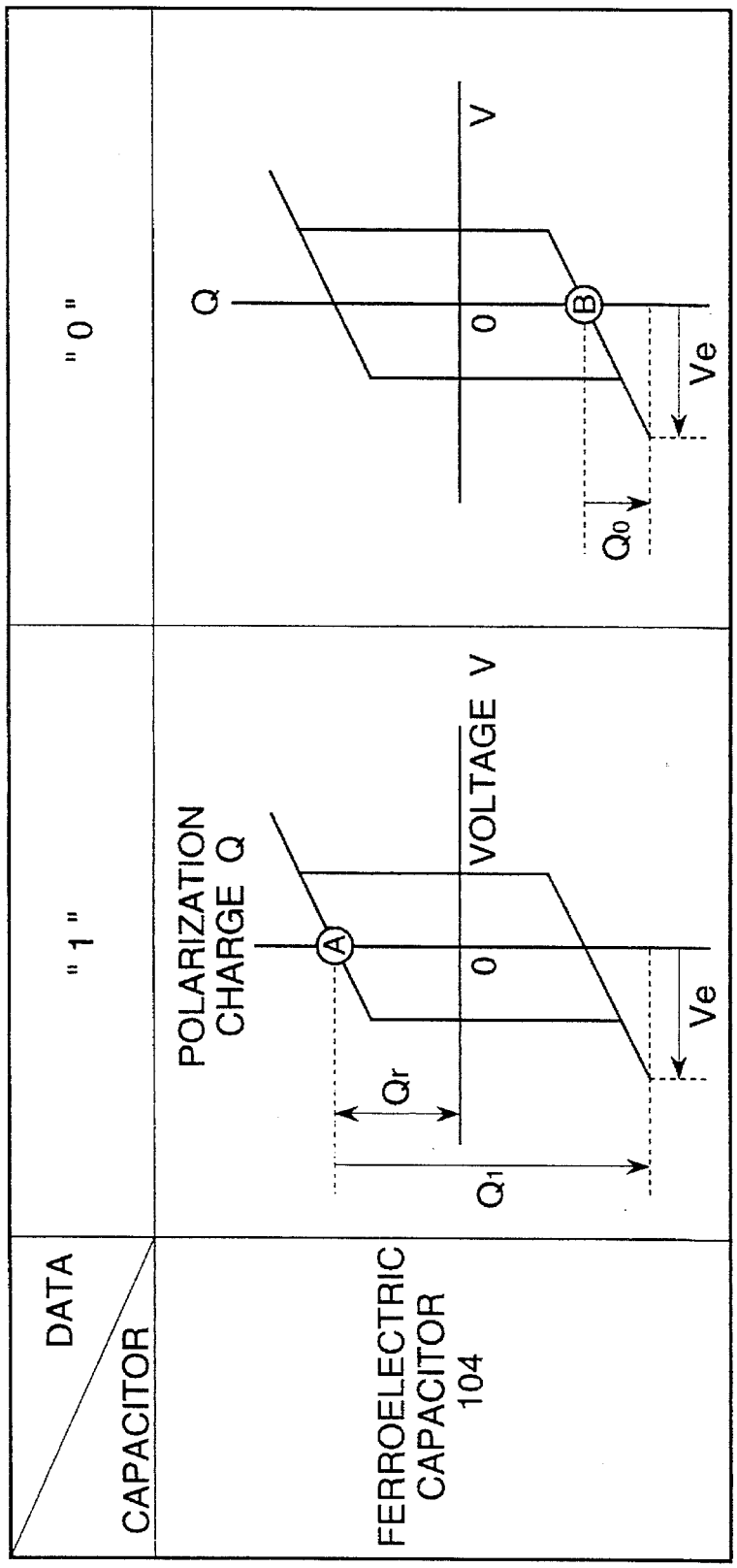
FIG. 6 illustrates a relation between the relation between the spontaneous polarization electric charge and the voltage between opposing electrodes of the ferroelectric capacitor, in the ferroelectric memory cell of the type shown in FIG. 5.

First, examine the 2T/2C type memory cell. It is assumed that data signal line parasitic capacitance of the sense amplifier and per each one memory cell and the CS value are the same as the above mentioned assumption, and the minimum voltage which can be normally data-amplified by the sense amplifier, is 100 mV, and the (Q1-Q0) (in FIG. 6) is 1000 fC. Under this assumption, if the equations (14) and (16) are applied, the following relation can be obtained:

$$1000fC/(50fF+5fF\times n+CC+200fF) \geq 100mV \qquad (21)$$

Accordingly, the following relation can be obtained:

$$1950 \geq n \qquad (22)$$

Next, examine the 1T/1C type memory cell. The same condition as that of the 2T/2C type memory cell is used, and the equations (15) and (16) are applied, the following relation can be obtained:

$$(\tfrac{1}{2}) \times 1000fC/(50fF+5fF\times n+CC+200fF) \geq 100mV \qquad (23)$$

Accordingly, the following relation can be obtained:

$$950 \geq n \qquad (24)$$

In the above mentioned manner, the restriction concerning the number "n" is examined, and the memory array construction, specifically the number of memory cells connected to each one data signal line is determined to fulfil the required condition. Thus, a voltage not smaller than the coercive voltage can be surely applied between the opposing electrodes of the ferroelectric capacitor, with the result that a sufficient read-out signal voltage can be obtained. Therefore, a stable operation of the ferroelectric memory can be realized.

In the above mentioned embodiments, the 1T/1C type memory cell and the 2T/2C type memory cell have been used as the memory cell, but the present invention is not limited to only these types of memory. The present invention can be similarly applied to all ferroelectric memories having such an operating system in which when a voltage is applied between opposing electrodes of the ferroelectric capacitor in order to read out the data from the ferroelectric memory cell, a voltage variation occurs on a node connected to the electrode of the ferroelectric capacitor, and the voltage variation is a problem. The above mentioned embodiments can be selectively combined to realize the memory which can realize the present invention.

In addition, the present invention is characterized in that, when the memory cell selection signal line is activated to read the data from the ferroelectric memory cell, the means for apply a sufficient voltage for inverting the polarization of the ferroelectric material of the ferroelectric capacitor, between the opposing electrodes of the ferroelectric capacitor, is realized by adding the limitation to the number of memory cells connected to each one data signal line. Therefore, the present invention can be applied without depending upon the other factors of the memory, for example, the memory cell selection control method, the data signal line precharge method, the amplification manner of the sense amplifier, and the reference level generating method.

As seen from the above, the ferroelectric memory in accordance with the present invention can avoid the problem of the prior art in which when the data is read out from the memory cell, the voltage of the data signal line varies, so that a voltage not smaller than the coercive voltage is not applied between the opposing electrodes of the ferroelectric capacitor, with the result that a sufficient read-out signal voltage cannot be obtained. Therefore, a stable operation of the ferroelectric memory can be realized.

The invention has thus been shown and described with reference to the specific embodiments. However, it should be noted that the present invention is in no way limited to the details of the illustrated structures but changes and modifications may be made within the scope of the appended claims.

I claim:

1. A ferroelectric memory comprising, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data; and a means connected to the corresponding one pair of data signal lines, for detecting said current or said voltage difference appearing between the corresponding pair of data signal lines, at least enough of said memory cells connected to each one data signal line to adjust a parasitic capacitance of each said data signal line, when data is read out from a memory cell, so as to minimize a variation of the voltage on said at least one of the corresponding pair of data signal lines caused by said parasitic capacitance.

2. A ferroelectric memory claimed in claim 1 wherein each of said memory cells includes at least one ferroelectric capacitor and at least one transistor.

3. A ferroelectric memory claimed in claim 1 wherein each of said memory cells includes at least one ferroelectric capacitor and at least one transistor, first and second opposing electrodes of said at least one ferroelectric capacitor being connected to a source of said at least one transistor and a plate line, a drain of said at least one transistor being connected to said one of said corresponding pair of data signal lines, and a gate of said at least one transistor being connected to said corresponding one of said selection signal lines.

4. A ferroelectric memory claimed in claim 1 wherein each of said memory cells includes first and second ferroelectric capacitors and first and second transistors, first and second opposing electrodes of said first ferroelectric capacitor being connected to a source of said first transistor and a plate line, a drain of said first transistor being connected to said one of said corresponding pair of data signal lines, and a gate of said first transistor being connected to said corresponding one of said selection signal lines, and first and second opposing electrodes of said second ferroelectric capacitor being connected to a source of said second transistor and said plate line, a drain of said second transistor being connected to the other of said corresponding pair of data signal lines, and a gate of said second transistor being connected to said corresponding one of said selection signal lines.

5. A ferroelectric memory claimed in claim 1 wherein each of said memory cells includes one ferroelectric capacitor and first and second transistors, first and second opposing electrodes of said ferroelectric capacitor being connected to a source of said first transistor and a source of said second transistor, respectively, a drain of said first transistor being connected to said one of said corresponding pair of data signal lines, and a gate of said first transistor being connected to said corresponding one of said selection signal lines, a drain of said second transistor being connected to the other of said corresponding pair of data signal lines, and a gate of said second transistor being connected to said corresponding one of said selection signal lines.

6. A method for controlling an operation of a ferroelectric memory which comprises, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data;

a means connected to the corresponding one pair of data signal lines, for detecting said current or said voltage difference appearing between the corresponding pair of data signal lines, at least enough of said memory cells connected to each one data signal line to adjust a parasitic capacitance of each said data signal line, when data is read out from a memory cell, so as to minimize a variation of the voltage on said at least one of the corresponding pair of data signal lines caused by said parasitic capacitance, the method performing the reading of data from said memory cell to be read out, by setting the corresponding data signal line connected to said memory cell to be read out, to a second voltage, by setting a plate line connected to said memory cell to be read out, to a third voltage which is different from said second voltage and also different from a fourth voltage before the data reading operation, by setting said selection signal line connected to said memory cell to be read out, to a fifth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

7. The method claimed in claim 6 wherein, under the assumption that a parasitic capacitance of said corresponding data signal line is CD; a capacitance of the normal dielectric component of said ferroelectric capacitor is CS; a coercive voltage converted by multiplying a coercive electric field of said ferroelectric capacitor by a film thickness of a ferroelectric material of said ferroelectric capacitor is Vc; said fifth voltage is VPL0; said third voltage is VPL; said second voltage is VDL0; and an initial voltage of a node interconnecting said switching means of said memory cell and said ferroelectric capacitor before the reading operation, is VS0, the number of memory cells connected to each one data signal line is so determined as to cause said parasitic capacitance CD of said corresponding data signal line to fulfil the following relation:

$$\left| \frac{CS \times (VPL0 - VS0) + CD \times (VPL - VDL0)}{CD + CS} \right| \geq Vc$$

so that a voltage variation on said data signal line caused by driving said plate line at the time of reading the data is minimized, whereby a voltage not smaller than said coercive voltage is applied between said opposing electrodes of said ferroelectric capacitor.

8. The method claimed in claim 6 wherein, under the assumption that a parasitic capacitance of said corresponding data signal line is CD; a capacitance of the normal dielectric component of said ferroelectric capacitor is CS; a remnant polarization electric charge of said ferroelectric capacitor is Qr; and a minimum voltage value which can be normally amplified by a voltage type sense amplifier, is VSE, said parasitic capacitance CD of said corresponding data signal line is determined to fulfil the following relation:

$$\frac{Qr}{CD + CS} \geq VSE.$$

9. The method claimed in claim 6 wherein, under the assumption that a parasitic capacitance of said corresponding data signal line is CD; a capacitance of the normal dielectric component of said ferroelectric capacitor is CS; a remnant polarization electric charge of said ferroelectric capacitor is Qr; and a minimum voltage value which can be normally amplified by a voltage type sense amplifier, is VSE, said parasitic capacitance CD of said corresponding data signal line is determined to fulfil the following relation:

$$\frac{2 \times Qr}{CD + CS} \geq VSE.$$

10. A method for controlling an operation of a ferroelectric memory which comprises, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data;

a means connected to the corresponding one pair of data signal lines, for detecting said current or said voltage difference appearing between the corresponding pair of data signal lines, at least enough of said memory cells connected to each one data signal line to adjust a parasitic capacitance of each said data signal line, when data is read out from a memory cell, so as to minimize a variation of the voltage on said at least one of the corresponding pair of data signal lines caused by said parasitic capacitance, the method performing the reading of data from said memory cell to be read out, by setting the corresponding data signal line connected to said memory cell to be read out, to a second voltage, by setting a plate line connected to said memory cell to be read out, to a third voltage which is a fixed voltage different from said second voltage, by setting said selection signal line connected to said memory cell to be read out, to a fourth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

11. The method claimed in claim 10 wherein, under the assumption that a parasitic capacitance of said corresponding data signal line is CD; a capacitance of the normal dielectric component of said ferroelectric capacitor is CS; a coercive voltage converted by multiplying a coercive electric field of said ferroelectric capacitor by a film thickness of a ferroelectric material of said ferroelectric capacitor is Vc; said third voltage is VPLC; said second voltage is VDL0; and an initial voltage of a node interconnecting said switching means of said memory cell and said ferroelectric capacitor before the reading operation, is VS0, the number of memory cells connected to each one data signal line is so determined as to cause said parasitic capacitance CD of said corresponding data signal line to fulfil the following relation:

$$\left| \frac{CS \times (VPCL - VS0) + CD \times (VPLC - VDL0)}{CD + CS} \right| \geq V_c$$

so that a voltage variation on said data signal line caused by driving said plate line at the time of reading the data is minimized, whereby a voltage not smaller than said coercive voltage is applied between said opposing electrodes of said ferroelectric capacitor.

12. The method claimed in claim 10 wherein, under the assumption that a parasitic capacitance of said corresponding data signal line is CD; a capacitance of the normal dielectric component of said ferroelectric capacitor is CS; a remnant polarization electric charge of said ferroelectric capacitor is Qr; and a minimum voltage value which can be normally amplified by a voltage type sense amplifier, is VSE, said parasitic capacitance CD of said corresponding data signal line is determined to fulfil the following relation:

$$\frac{Qr}{CD + CS} \geq VSE.$$

13. The method claimed in claim 10 wherein, under the assumption that a parasitic capacitance of said corresponding data signal line is CD; a capacitance of the normal dielectric component of said ferroelectric capacitor is CS; a remnant polarization electric charge of said ferroelectric capacitor is Qr; and a minimum voltage value which can be normally amplified by a voltage type sense amplifier, is VSE, said parasitic capacitance CD of said corresponding data signal line is determined to fulfil the following relation:

$$\frac{2 \times Qr}{CD + CS} \geq VSE.$$

* * * * *